(12) United States Patent
Aritome

(10) Patent No.: US 7,697,335 B2
(45) Date of Patent: Apr. 13, 2010

(54) MULTIPLE SELECT GATE ARCHITECTURE

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/141,718

(22) Filed: Jun. 18, 2008

(65) Prior Publication Data

US 2008/0253187 A1  Oct. 16, 2008

Related U.S. Application Data

(62) Division of application No. 11/216,755, filed on Aug. 31, 2005, now Pat. No. 7,394,693.

(51) Int. Cl.
*G11C 16/04* (2006.01)

(52) U.S. Cl. .............................. 365/185.17; 365/185.05

(58) Field of Classification Search ............ 365/185.17, 365/185.05
See application file for complete search history.

(56) References Cited

U.S. PATENT DOCUMENTS

| | | | |
|---|---|---|---|
| 5,396,098 A | 3/1995 | Kim et al. | |
| 5,434,814 A | 7/1995 | Cho et al. | |
| 5,999,452 A | 12/1999 | Chen et al. | |
| 6,266,275 B1 | 7/2001 | Chen et al. | |
| 6,380,636 B1 | 4/2002 | Tatsukawa et al. | |
| 6,512,253 B2 | 1/2003 | Wantanabe et al. | |
| 6,720,612 B2 | 4/2004 | Takeuchi et al. | |
| 6,784,041 B2 | 8/2004 | Takeuchi et al. | |
| 6,784,503 B2 | 8/2004 | Shimizu et al. | |
| 7,193,897 B2 | 3/2007 | Lee | |
| 7,196,930 B2 | 3/2007 | Han | |
| 7,272,042 B2 * | 9/2007 | Nakai | 365/185.17 |
| 7,315,473 B2 | 1/2008 | Kawai et al. | |
| 7,315,477 B2 | 1/2008 | Chen | |
| 7,518,915 B2 * | 4/2009 | Noguchi | 365/185.05 |
| 7,539,056 B2 * | 5/2009 | Katsumata et al. | 365/185.18 |
| 2006/0120155 A1 | 6/2006 | Sato et al. | |
| 2007/0171720 A1 * | 7/2007 | Noguchi | 365/185.17 |
| 2007/0297232 A1 * | 12/2007 | Iwata | 365/185.17 |
| 2009/0135656 A1 * | 5/2009 | Park | 365/185.19 |

OTHER PUBLICATIONS

D.J. Kim et al.; Process Integration for the High Speed NAND Flash Memory Cell; VLSI Technology Digest of Technical Papers; 1996; pp. 236-238.

* cited by examiner

*Primary Examiner*—Tuan T. Nguyen
(74) *Attorney, Agent, or Firm*—Leffert Jay & Polglaze, P.A.

(57) ABSTRACT

Non-volatile memory devices including multiple series-coupled select gates on the drain and/or source ends of strings of non-volatile memory cells. By utilizing multiple series-coupled select gates, each gate can be made using smaller features sizes while achieving the same level of protection against GIDL and other forms of current leakage. By reducing the feature size of the select gates, the footprint of the strings of memory cells can be reduced, thereby facilitating smaller memory device sizing. Further reductions in device sizing may be achieved utilizing a staggered self-aligned bit line contact configuration.

20 Claims, 12 Drawing Sheets

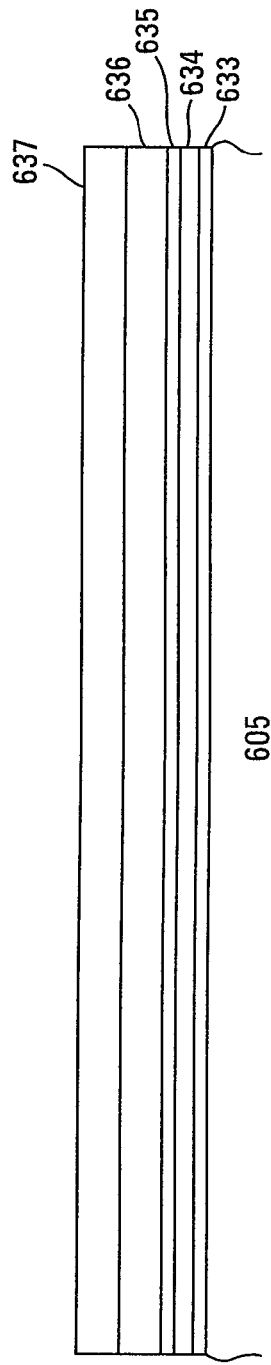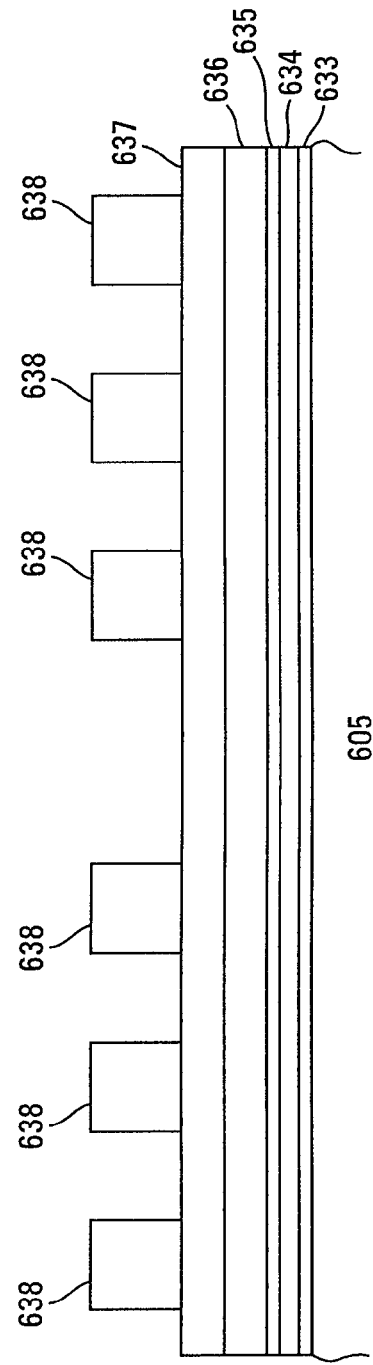

MULTIPLE SELECT GATE ARCHITECTURE

RELATED APPLICATIONS

This application is a divisional of U.S. patent application Ser. No. 11/216,755 (allowed), filed Aug. 31, 2005 now U.S. Pat No. 7,394,693 and titled, "MULTIPLE SELECT GATE ARCHITECTURE," which is commonly assigned and incorporated by reference in its entirety herein.

TECHNICAL FIELD OF THE INVENTION

The present invention relates generally to semiconductor memory devices, and in particular, the present invention relates to memory devices having multiple select gates for drain side and/or source side of, for example, NAND strings.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, cellular telephones and removable memory modules.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As the performance of electronic systems employing flash memory devices increases, flash memory device performance should also increase. A performance increase includes reducing power consumption, increasing speed, and increasing the memory density. One way to accomplish these tasks is by decreasing the size of the memory array and its individual devices.

Unfortunately, there can be resulting problems with decreasing device sizes. For example, as the channel length and gate oxide thickness are reduced in a field-effect transistor, leakage current generally increases. One type of leakage current is gate induced drain leakage (GIDL) that results from the depletion at the drain surface below the gate-drain overlap region.

GIDL can cause a problem referred to as program disturb during a programming operation of a flash memory array. For example, FIG. 1 illustrates a portion of a typical prior art NAND flash memory array. During a program operation to program a memory cell 101, the word line 102 coupled to that cell 101 may be biased with a 20V programming pulse. The bit line 104 coupled to that cell may be brought to ground potential. This provides a gate to source potential of 20V across the cell 101 to be programmed.

The other cells on the selected word line 102 will also have the 20V programming pulse applied. In order to inhibit these cells from being programmed, their bit lines 104 may be biased to Vcc. Additionally, the remaining unselected word lines may be biased with 10V pulses. This biasing creates a channel voltage of approximately 7V on the unselected cell 103. This provides a gate to source voltage of approximately 13V that is generally below the required programming voltage for such cells.

However, the resulting drain to gate field for the drain select gates (SGD) and source select gates (SGS) may, in this scenario, approach 7V, which can cause the 7V channel potential on the unselected cell 103 to leak away, thus creating the possibility that the unselected cell 103 is programmed. This is referred to in the art as program disturb. To mitigate the effects of GIDL, and thus to mitigate the occurrence of program disturb, select transistors of the NAND strings are generally sized to have a gate length much greater than any of the memory cells of the string. Increasing the gate length of the select transistors runs counter to the desire to decrease memory array size.

For the reasons stated above, and for other reasons stated below which will become apparent to those skilled in the art upon reading and understanding the present specification, there is a need in the art for alternative memory device architectures.

BRIEF DESCRIPTION OF THE DRAWINGS

FIGS. 6A-6G are cross-sectional views of portions of NAND memory stings in accordance with another embodiment of the invention during various stages of fabrication.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

Figure 2:
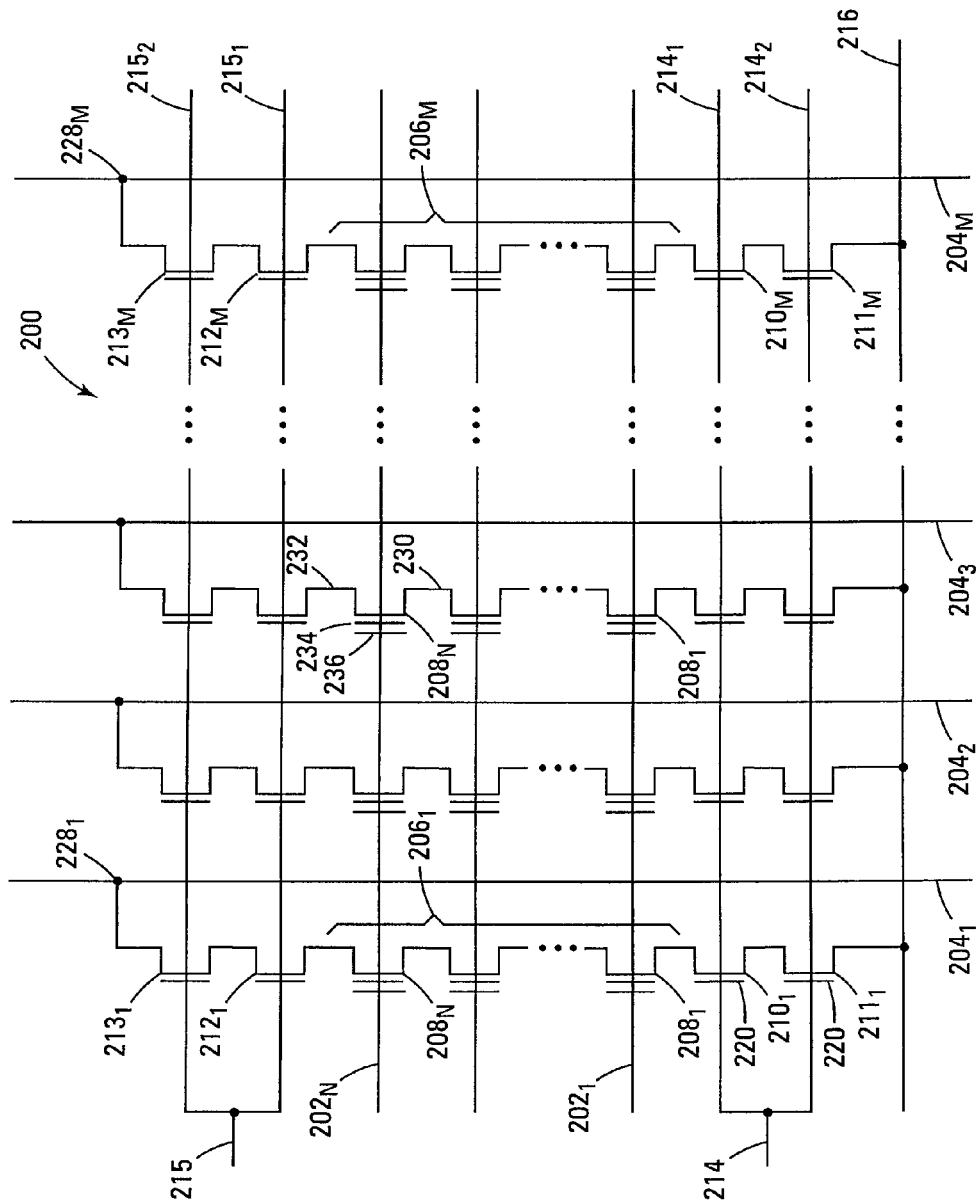
FIG. 2 is a schematic of a portion of a NAND memory array in accordance with an embodiment of the invention.

FIG. 2 is a schematic of a portion of a NAND memory array 200 in accordance with an embodiment of the invention. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes non-volatile memory cells $208_1$ to $208_N$, each located at an intersection of a word line 202 and a local bit line 204. The non-volatile memory cells 208 of each NAND string 206 are connected in series source to drain between series-connected source select gates 210 and 211, e.g., field-effect transistors (FETs), and series-connected drain select gates 212 and 213, e.g., FETs. Source select gates 210 and 211 are located at intersections of a local bit line 204 and source select lines 214, while drain select gates 212 and 213 are located at intersections of a local bit line 204 and drain select lines 215. For one embodiment, source select gates 210 and 211 and/or drain select gates 212 and 213 are enhancement-type devices.

A source of each source select gate 211 is connected to a common source line 216. The drain of each source select gate 211 is connected to the source of a corresponding source select gate 210. The drain of each source select gate 210 is connected to the source of the first floating-gate transistor 208 of the corresponding NAND string 206. For example, the drain of source select gate $211_1$ is connected to the source of source select gate $210_1$, which is connected to the source of floating-gate transistor $208_1$ of the corresponding NAND string $206_1$. A control gate 220 of each source select gate 210 and 211 is connected to source select line 214.

The drain of each drain select gate 213 is connected to a local bit line 204 for the corresponding NAND string at a drain contact 228. For example, the drain of drain select gate $213_1$ is connected to the local bit line $204_1$ for the corresponding NAND string $206_1$ at drain contact $228_1$. The source of each drain select gate 213 is connected to the drain of the corresponding drain select gate 212. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of non-volatile memory cells 208 includes a source 230 and a drain 232, a floating gate or charge storage layer 234, and a control gate 236, as shown in FIG. 2. Non-volatile memory cells 208 have their control gates 236 coupled to a word line 202. A column of the non-volatile memory cells 208 are those NAND strings 206 coupled to a given local bit line 204. A row of the non-volatile memory cells 208 are those transistors commonly coupled to a given word line 202. An AND array architecture would be similarly laid out except that the string of memory cells would be coupled in parallel between the select gates.

Figure 3:
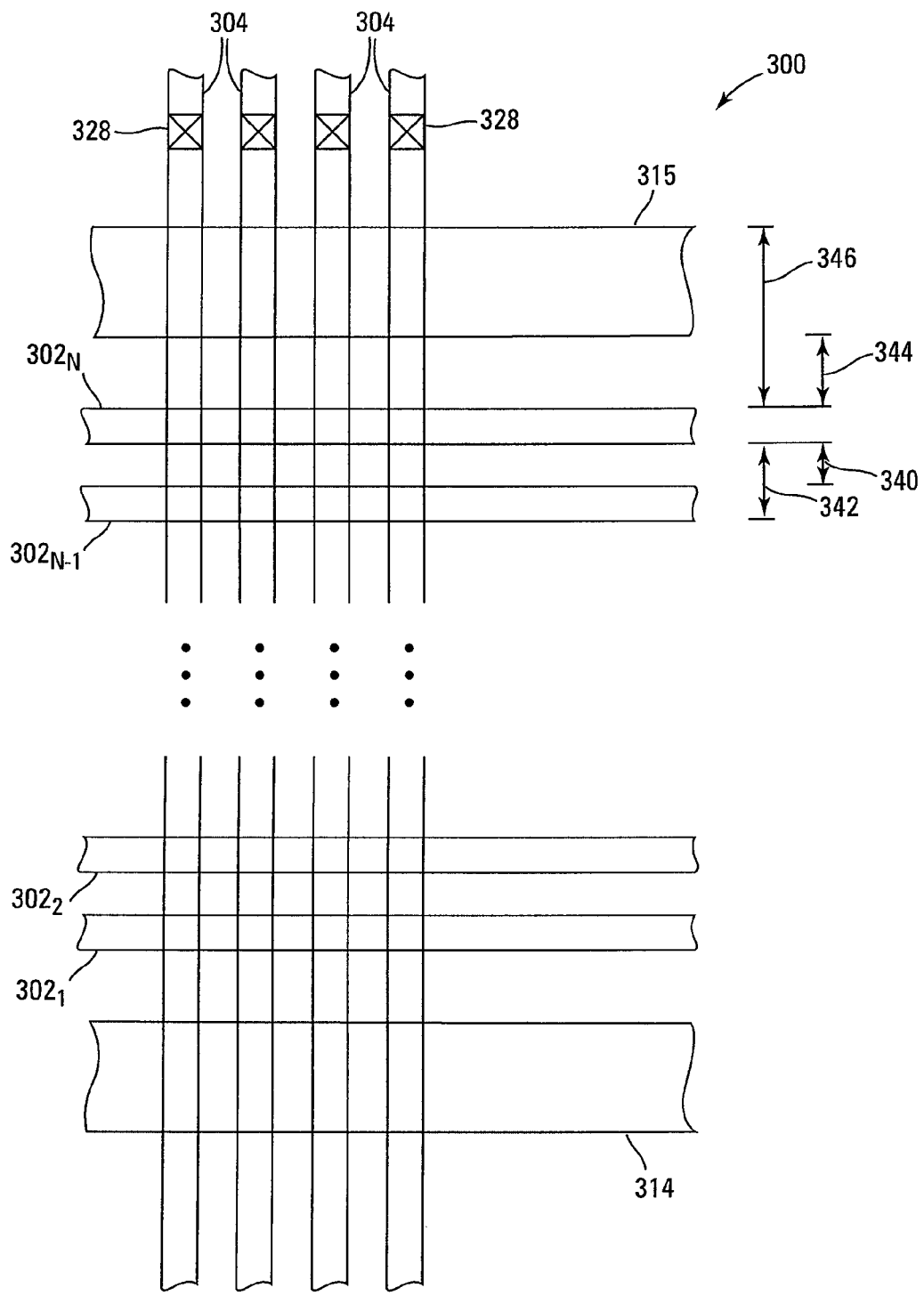
FIG. 3 is a top view of a portion of a NAND memory array architecture of the prior art.

FIG. 3 is a top view of a portion of a NAND memory array architecture of the prior art. As depicted in FIG. 3, the memory array 300 includes one or more bit lines 304 and one or more intersecting word lines 302. The bit lines 304 are coupled to drain regions (not shown in FIG. 3) of select line 315 through bit line contacts 328. As discussed in the background, to avoid current leakage or punch-through from the relatively high voltages used in programming non-volatile memory cells, the source select line 314 and the drain select line 315 of the prior art generally are sized to have a channel length much greater than the memory cells. For example, the separation 340 between adjacent word lines 302 may be the minimum feature size of the capabilities of the process chosen for fabrication of the memory array 300. The word line pitch 342 includes the width of a word line 302 and the separation 340 between adjacent word lines 302. As depicted in FIG. 3, the width of a word line 302 and the separation 340 are equal, e.g., each having the minimum feature size. To mitigate current leakage using this architecture, it is generally chosen to have a separation 344 between an end word line $302_1$ or $302_N$ and its corresponding select line 314 or 315, respectively, of approximately twice the minimum feature size and a width of the select line 314 or 315 (corresponding to a gate length) of approximately three times the minimum feature size such that a pitch 346 of a select line 314 or 315 is approximately five times the minimum feature size or approximately 2½ times the pitch 342 of the word lines 302.

The various embodiments facilitate reductions in array footprint without reducing the size or spacing of the memory cells. This is accomplished by providing an extra select gate at each end of a NAND string. Although this may appear counterproductive, each select gate may be fabricated using a smaller channel length and may be positioned closer to the end word line such that the total distance between an end word line and the outer edge of the select gates is less than the pitch 346 as depicted in FIG. 3 while providing equivalent or improved shut-off characteristics and protection against current leakage. In this manner, the distance between a source line and a bit line contact may be reduced without reducing word line pitch. In addition, the smaller device size permits operation at reduced threshold voltages.

Figure 4:
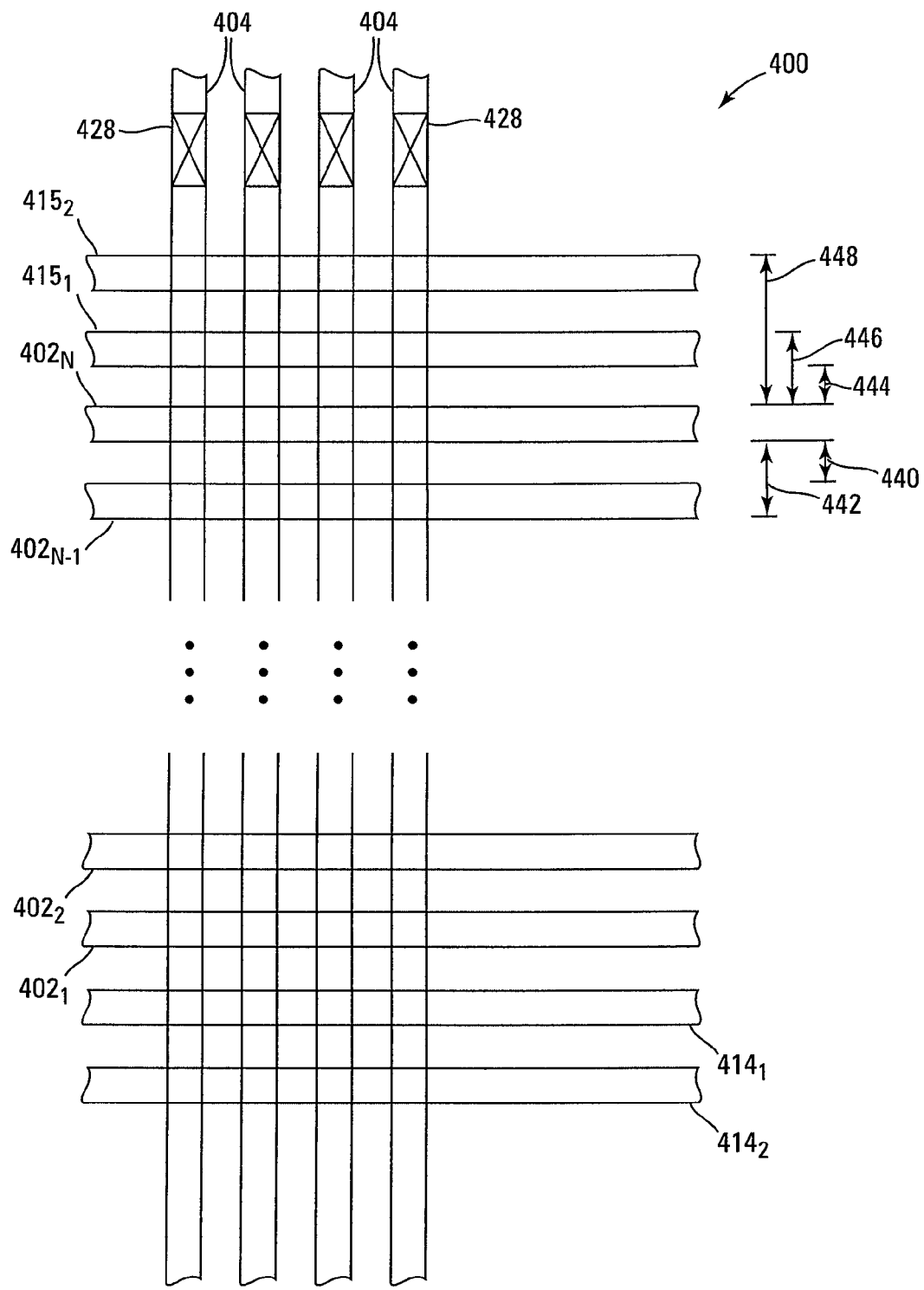
FIG. 4 is a top view of a portion of a NAND memory array architecture in accordance with an embodiment of the invention.

FIG. 4 is a top view of a portion of a NAND memory array architecture in accordance with an embodiment of the invention. As depicted in FIG. 4, the memory array 400 includes one or more bit lines 404 and one or more intersecting word lines 402. The bit lines 404 are coupled to drain regions (not shown in FIG. 4) of drain select line $415_2$ through bit line contacts 428. For various embodiments, two select lines are included at each end of a NAND string, i.e., two source select lines $414_1$ and $414_2$ are coupled in series between one end of a NAND string (word line $402_1$) and a source line (not shown in FIG. 4), and two drain select lines $415_1$ and $415_2$ are coupled in series between the other end of the NAND string (word line $402_N$) and a corresponding bit line contact 428.

As with standard array architecture, the separation 440 between adjacent word lines 402 may be the minimum feature size of the capabilities of the process chosen for fabrication of the memory array 400. The word-line pitch 442 includes the width of a word line 402 and the separation 440 between adjacent word lines 402. For one embodiment, the width of a word line 402 and the separation 440 are equal, e.g., each may have the minimum feature size. For other embodiments, the pitch 442 may be twice the minimum feature size, but the separation 440 may be less than the minimum feature size. However, the invention is not dependent upon word line pitch or separation and other values for word line pitch 442 and/or word line separation 440 may be used.

For the embodiment depicted, the drain select lines $415_1$ and $415_2$ have a pitch 446 substantially equal to the pitch 442 of the word lines 402. Furthermore, the drain select lines $415_1$ and $415_2$ may have a separation 444 substantially equal to the separation 440 of the word lines 402. For the embodiment depicted in FIG. 4, the pitch and separation of the source select lines $414_1$ and $414_2$ are substantially equal to those of the drain select lines $415_1$ and $415_2$. However, symmetry between the source select lines and drain select lines is not required. Similarly, while having select line pitch 446 substantially equal to the word line pitch 442 and having select line separation 444 substantially equal to the word line separation 440 may provide fabrication efficiencies, such is not required. Other values for select line pitch 442 and/or select line separation 440 may be used. Using the same separation and pitch as the word lines 402, the distance 448 between an end word line ($402_1$ or $402_N$) and the outer edge of its corresponding select line ($414_2$ or $415_2$, respectively) could be sized to approximately twice the word line pitch 442, or approximately four times the minimum feature size.

Figure 5:
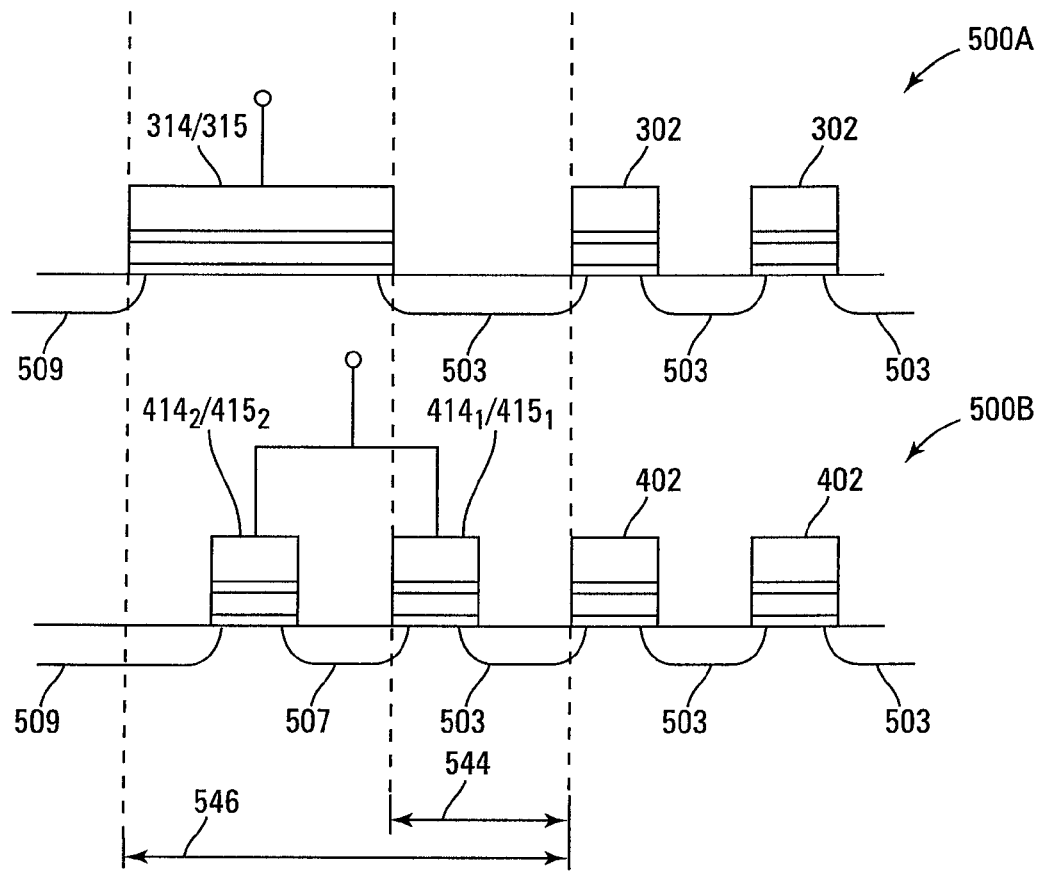
FIG. 5 is a cross-sectional view comparing a portion of a memory array of a prior art configuration with a portion of a memory array in accordance with an embodiment of the invention.

FIG. 5 is a cross-sectional view comparing a portion of a memory array 500A of a prior art configuration with a portion of a memory array 500B in accordance with an embodiment of the invention. FIG. 5 could depict either the source side or drain side of a NAND string and demonstrates the reduction in size facilitated by utilizing two select gates in series.

As depicted in FIG. 5, the distance 544 between a last word line 302 and the inner edge of a select line 314/315 is greater than a distance between a last word line 402 and the inner edge of a first select line $414_1/415_1$. Similarly, the distance 546 between a last word line 302 and the outer edge of a select line 314/315 is greater than a distance between a last word line 402 and the outer edge of a second select line $414_2/415_2$. Also as depicted in FIG. 5, the series-coupled select lines $414_1/414_2$ or $415_1/415_2$ may be configured to receive the same control voltage.

Figure 1:
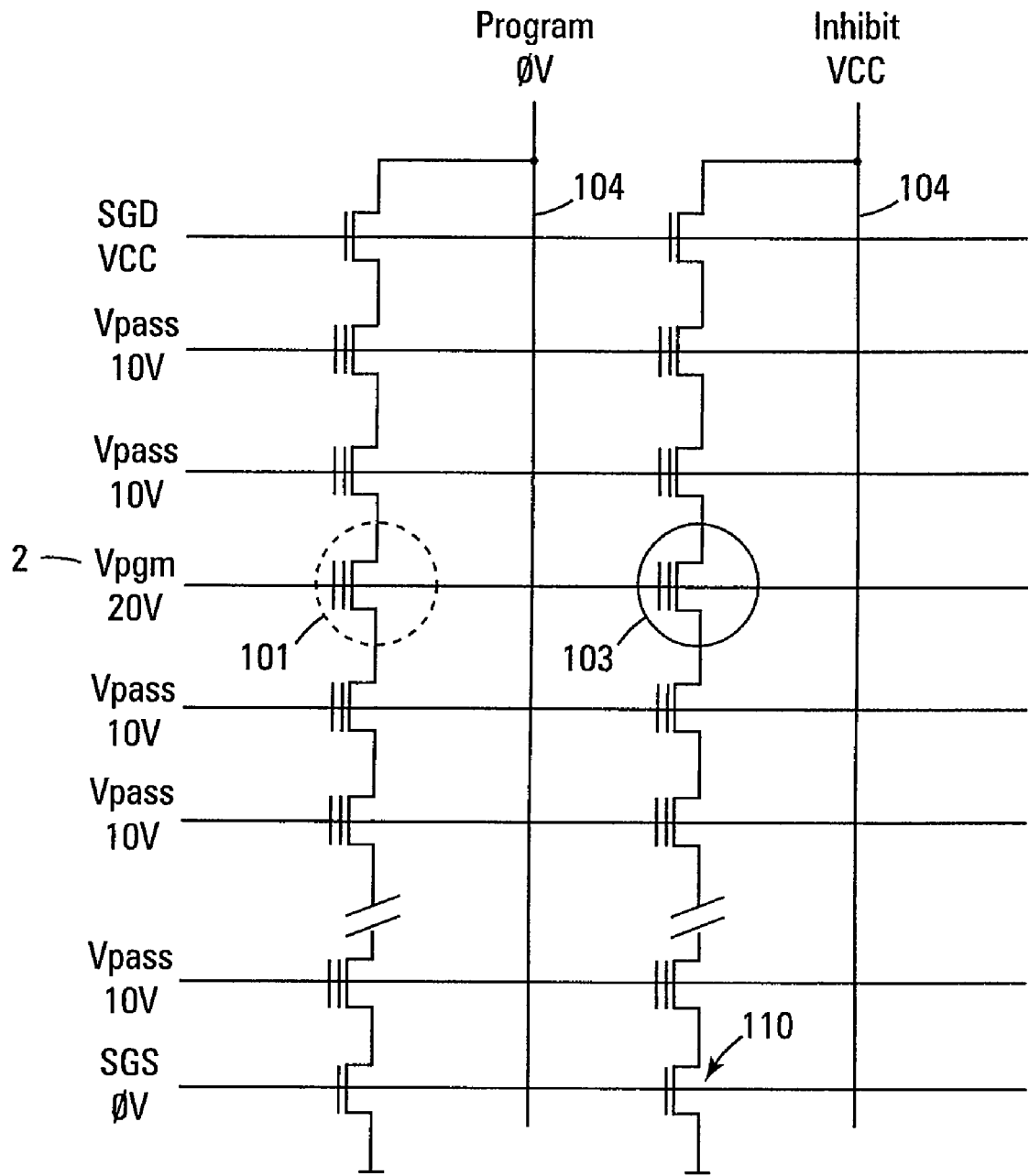
FIG. 1 is a schematic of a portion of a NAND memory array of the prior art.

As explained with reference to FIG. 1, the source/drain regions 503 may be boosted, e.g., to 7-8V, for an unselected NAND string while the source/drain regions 509 are coupled to receive a lower voltage such as Vcc, e.g., 1.8V. However, due to the voltage drop across the first select gate $414_1/415_1$ of memory array 500B, the source/drain region 507 will have an intermediate potential. For example, source/drain region 507 may have a potential level of approximately 1-2V in this scenario, which is sufficiently low to effectively mitigate GIDL from the second select gate $414_2/415_2$. Thus it can be seen that with smaller device size and closer spacing of the multiple select gates, a reduction in memory array size can be achieved without sacrificing shut-off and punch-through characteristics.

To achieve further reductions in memory array sizing, various embodiments may utilize a staggered and self-aligned bit line contact structure. FIGS. 6A-6G generally depict a method of forming a portion of a memory array in accordance with one embodiment of the invention.

Figure 6C:
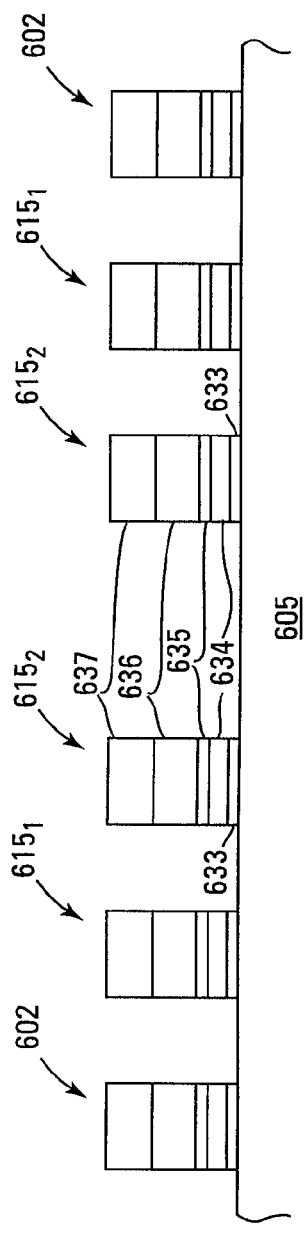

FIG. 6A depicts a portion of the memory array after several processing steps have occurred. Formation of the type of structure depicted in FIG. 6A is well known and will not be detailed herein. In general, FIG. 6A may depict a semiconductor substrate 605 upon which layers of future gate stacks of non-volatile memory cells are formed. For one embodiment, a tunnel dielectric layer 631, a floating-gate layer 634, an intergate dielectric layer 635, a control gate layer 636 and cap layer 637 have been formed on a substrate 605. The memory array of FIGS. 6A-6G will be discussed with reference to floating-gate non-volatile memory cells, although the concepts apply to other types of non-volatile memory cells. For example, the layers 631, 634 and 635 could represent a charge-trapping floating node arrangement, such as an ONO (oxide-nitride-oxide) structure of an NROM memory cell. Because the chosen layers for the gate stacks are not a feature or limitation of the invention, other structures may be chosen provided the memory cell gate stacks are capable to selectively providing one of two or more threshold voltages.

In FIG. 6B, a mask layer 638 is formed and patterned overlying the cap layer 637. As one example, a photolithographic resist material could be deposited as mask layer 638 overlying the cap layer 637, exposed to a radiation source, such as UV light, and developed to define areas overlying the cap layer 637 for removal.

Following this patterning of the mask layer 638, exposed portions of the cap layer 637 and underlying layers are removed in FIG. 6C, such as by etching or other removal process, to expose the substrate 605. More than one removal process may be used where the chosen removal process is ineffective at removing an underlying layer. Following removal, one or more gate stacks for word lines 602 and one or more gate stacks for select lines $615_1$ and $615_2$ are defined. Although the select line gate stacks $615_1$ and $615_2$ are depicted to have the same structure as the word line gate stacks 602, for improved conduction and faster operation it is typical to strap the conductive layers of select line gate stacks, e.g., floating-gate layer 634 and control gate layer 636 for this embodiment. Note that the portion of the memory array depicted in FIG. 6C includes portions of two adjacent NAND strings.

Figure 6D:
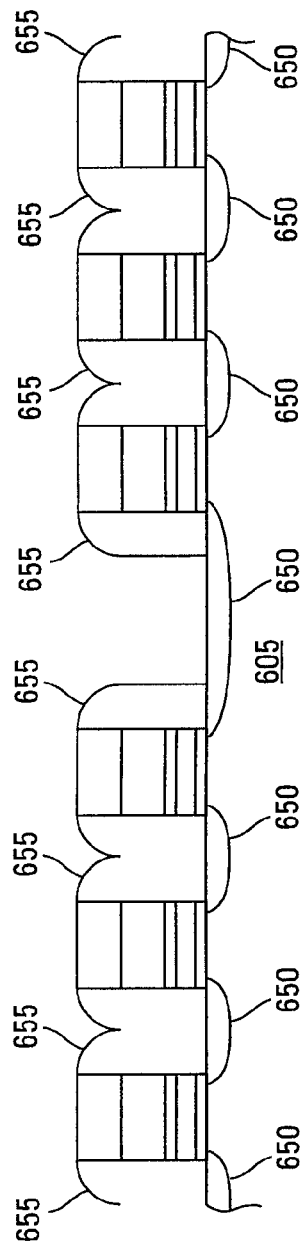

In FIG. 6D, source/drain regions 650 are formed, such as by conductive doping of portions of the substrate 605 exposed in FIG. 6C. Dielectric spacers 655 may also be formed. As one example, a blanket deposit of some dielectric material, e.g., silicon nitride, is formed overlying the gate stacks 602, $615_1$ and $615_2$, followed by an anisotropic removal of the blanket deposit to form spacers and expose portions of the substrate 605.

Figure 6E:
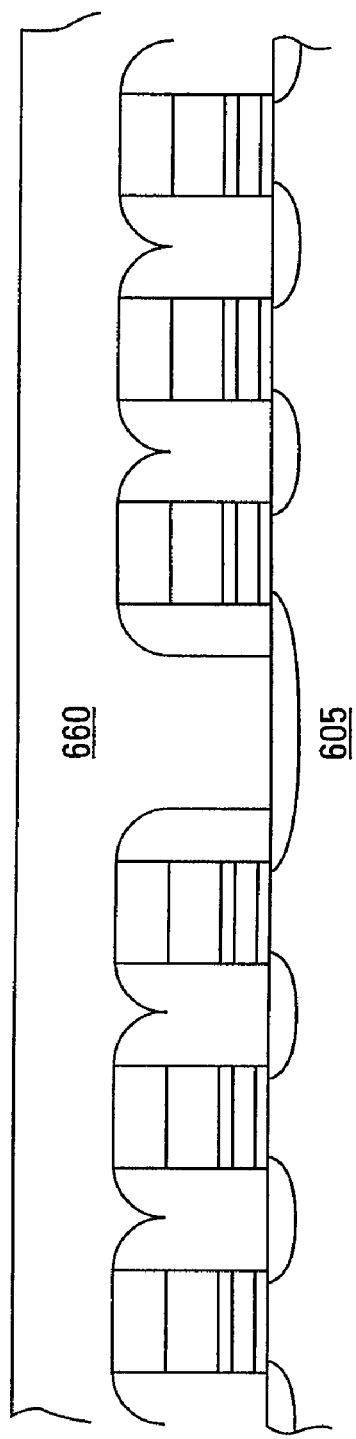
Figure 6F:
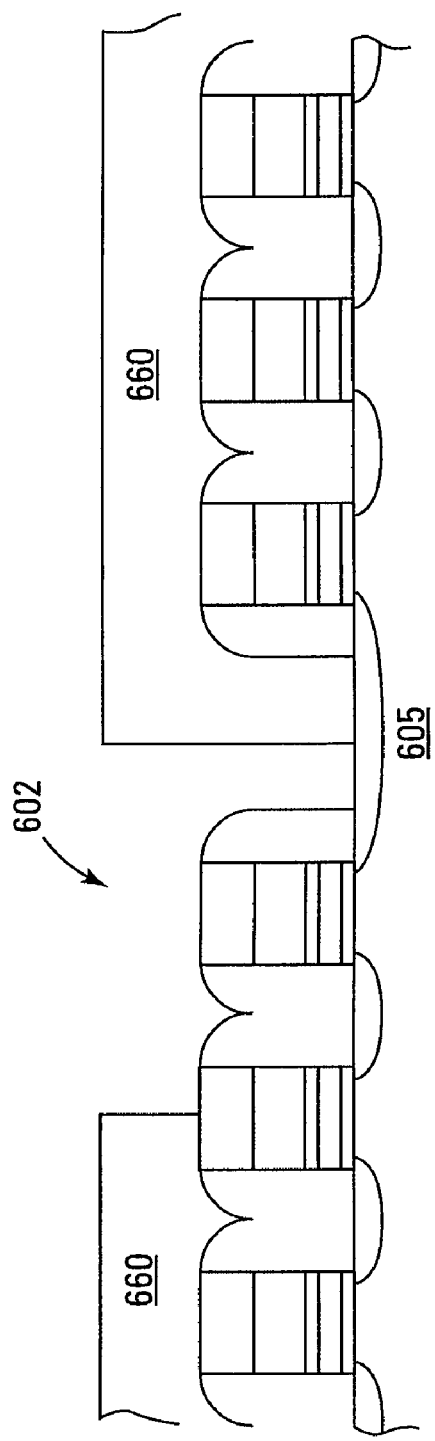

In FIG. 6E, a bulk dielectric layer 660 is formed overlying the gate stacks 602, $615_1$ and $615_2$. The bulk dielectric layer 660 may be any dielectric layer. As one example, the bulk dielectric layer 660 is a doped silicate material, such as borophosphosilicate glass (BPSG). In FIG. 6F, an opening 662 is formed in the bulk dielectric layer 660 overlying at least a portion of one of the select line gate stacks $615_2$ and exposing at least a portion of the source/drain region 650 located between select line gate stacks $615_2$ of adjacent NAND strings.

Figure 6G:
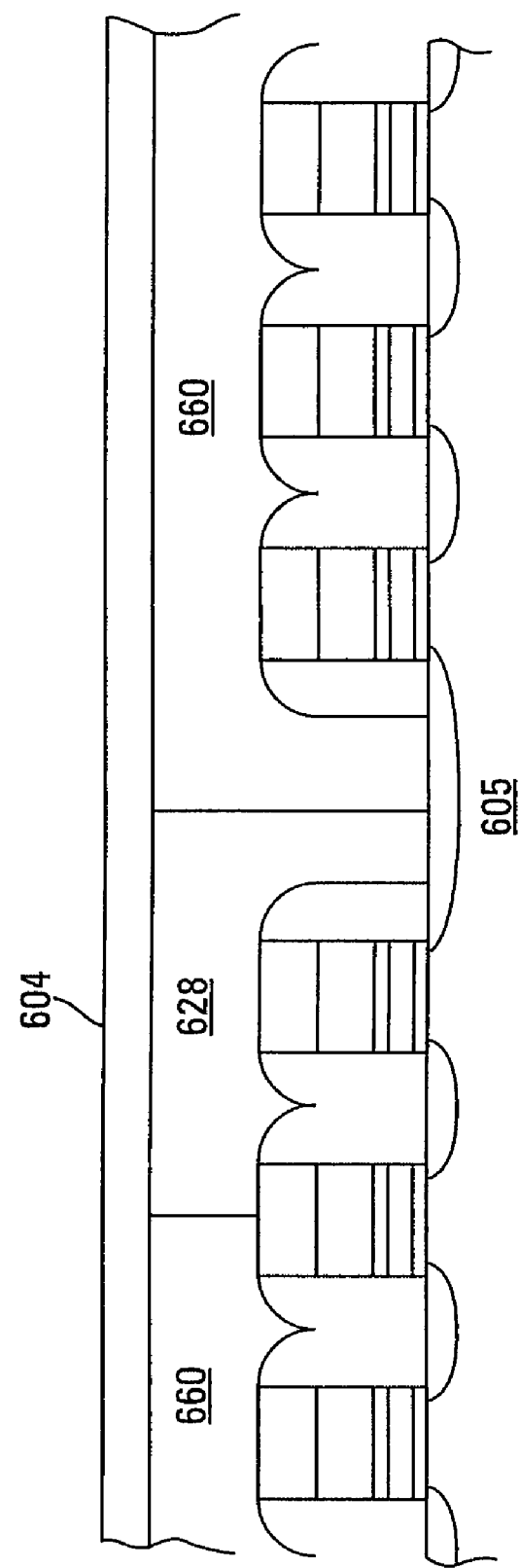

By forming the opening 662 to overlie at least a portion of a select line gate stack $615_2$, the contact area to the source/drain region 650 between adjacent outer select line gate stacks $615_2$ can be made smaller than the minimum feature size capabilities of the fabrication process used in forming the array. Alignment concerns are also lessened. In FIG. 6G, a bit line contact 628 is formed in the opening 662 and a bit line 604 is formed coupled to the bit line contact 628. Note that because these opposing strings of series-coupled memory cells are selectively coupled to the same bit line 604, the select gates $615_1$ and $615_2$ of each string must receive different control signals to selectively couple no more than one string to the bit line 604 during memory access.

Figure 7:
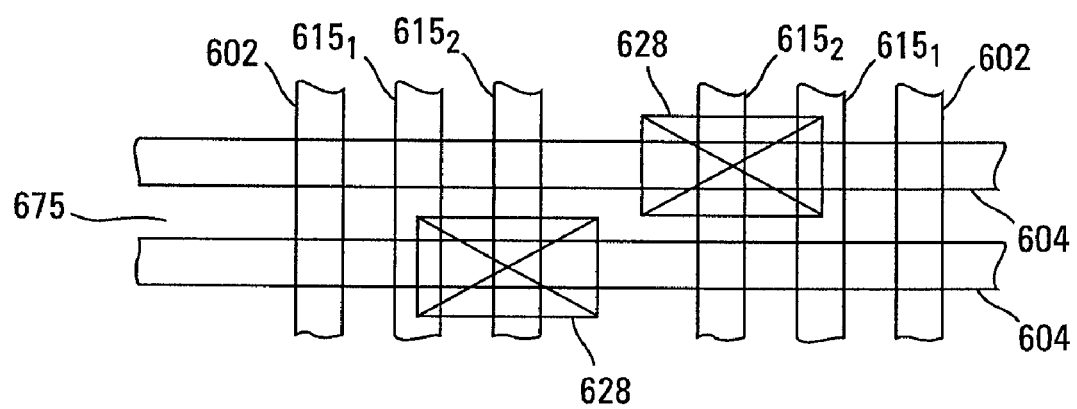
FIG. 7 is a top view of a portion of a NAND memory array architecture in accordance with a further embodiment of the invention.

FIG. 7 is a top view of the portion of the memory array of FIG. 6G depicting how the bit line contacts 628 could be staggered in alternating bit lines 604 to reduce likelihood of shorting between adjacent bit lines 604. It is noted that isolation regions 675, such as shallow trench isolation, are formed in the substrate 605 generally between adjacent word lines 604, thereby defining individual memory cells occurring at the intersections of a word line 602 and each bit line 604.

Figure 8:
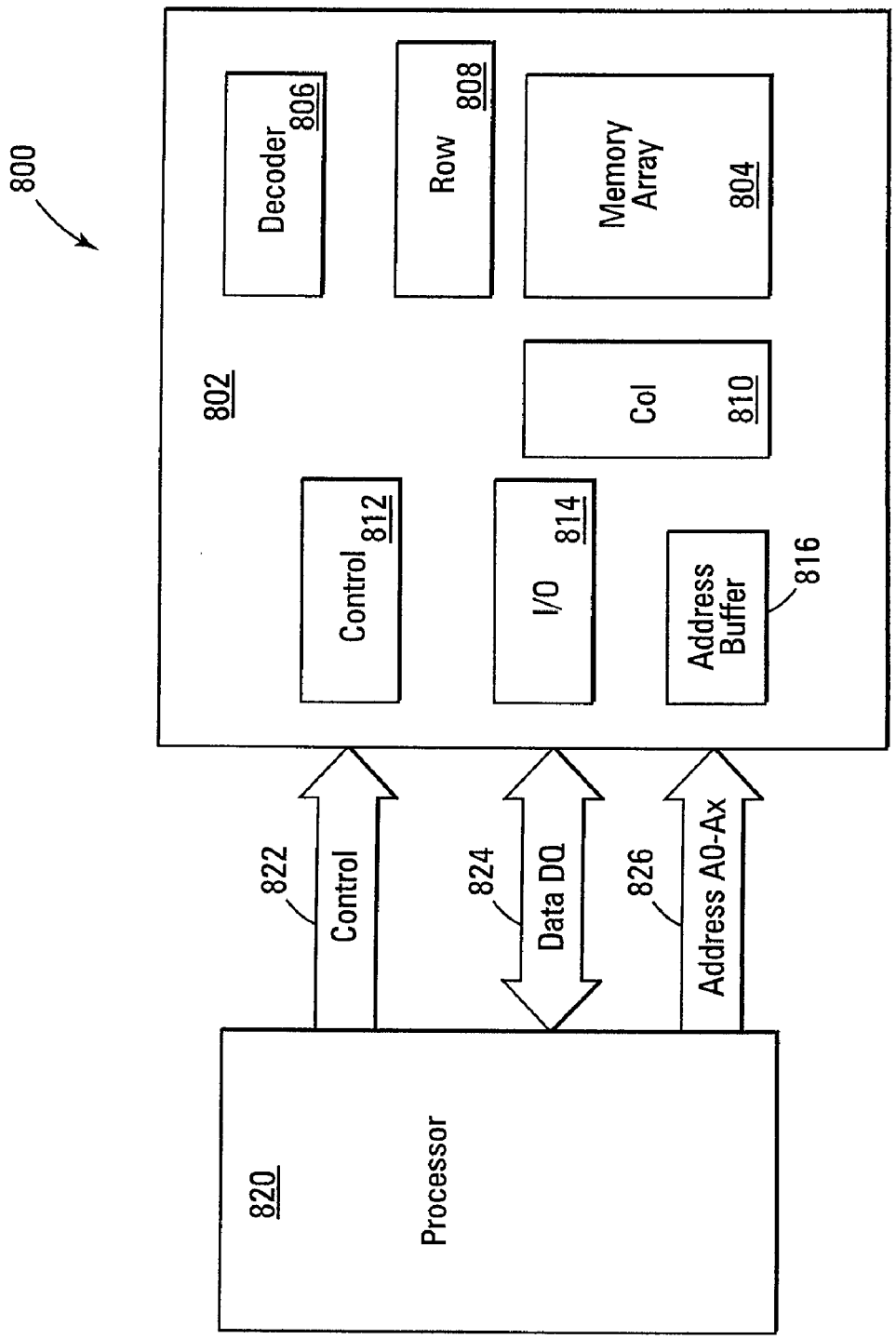
FIG. 8 is a functional block diagram of a electronic system having at least one memory device in accordance with an embodiment of the invention.

FIG. 8 is a simplified block diagram of an electronic system 800, according to an embodiment of the invention. Electronic system 800 includes a non-volatile memory device 802 that includes an array of non-volatile memory cells 804, an address decoder 806, row access circuitry 808, column access circuitry 810, control circuitry 812, Input/Output (I/O) circuitry 814, and an address buffer 816. The array of non-volatile memory cells 804 has a NAND architecture in accordance with an embodiment of the invention. The memory cells (not shown in FIG. 8) of the array of non-volatile memory cells 804 may be floating-gate memory cells, NROM cells or other type of one-transistor non-volatile memory cells.

Electronic system 800 includes an external processor 820, e.g., a memory controller or host processor, electrically connected to memory device 802 for memory accessing. The memory device 802 receives control signals from the processor 820 over a control link 822. The memory cells are used to store data that are accessed via a data (DQ) link 824. Address signals are received via an address link 826 that are decoded at address decoder 806 to access the memory array 804. Address buffer circuit 816 latches the address signals. The memory cells are accessed in response to the control signals and the address signals. The control link 822, data link 824 and address link 826 can be collectively referred to as access lines. It will be appreciated by those skilled in the art that additional circuitry and control signals can be provided, and that the memory device of FIG. 8 has been simplified to help focus on the invention.

Figure 9:
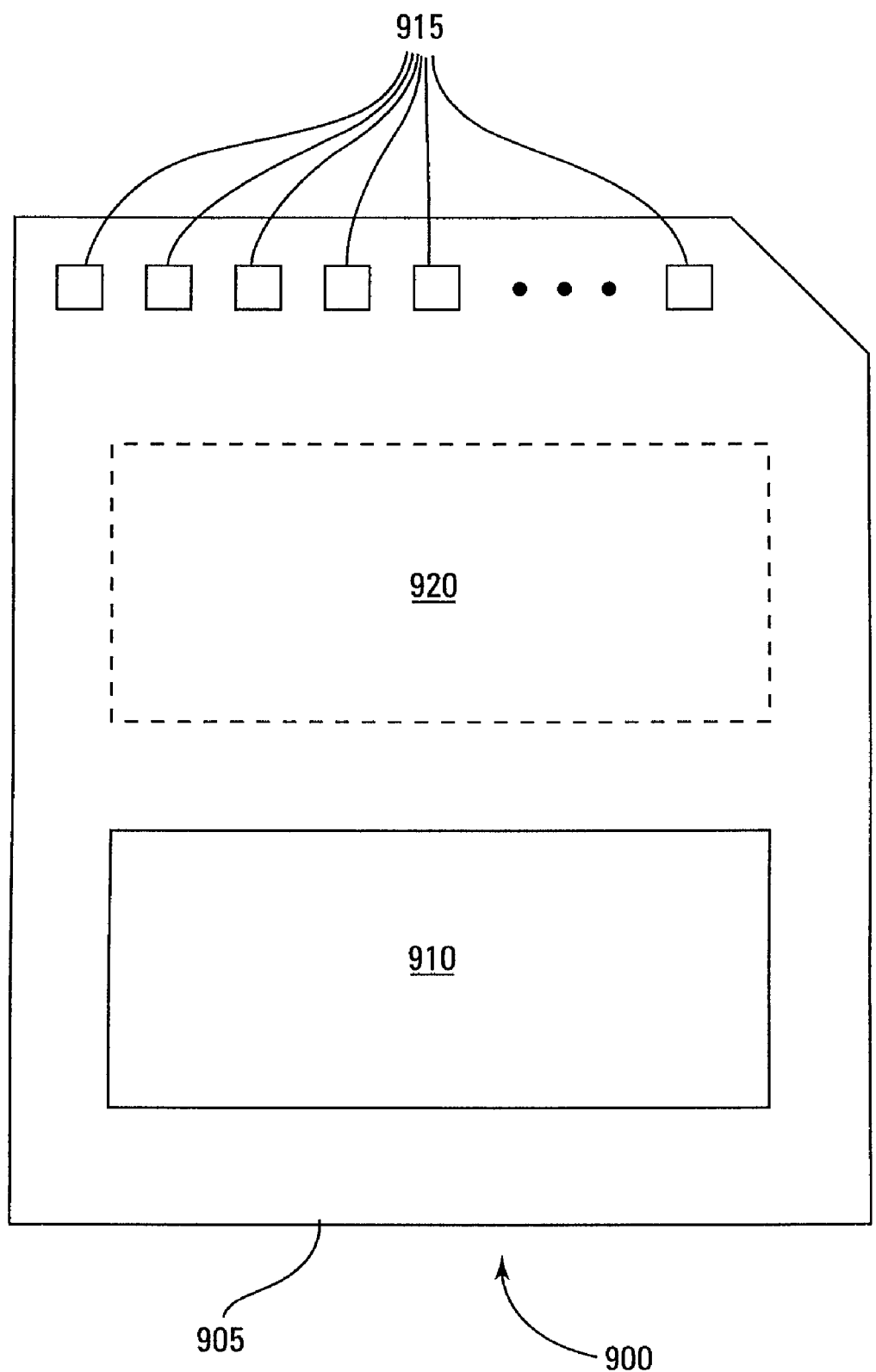
FIG. 9 is a functional block diagram of a memory module having at least one memory device in accordance with an embodiment of the invention.

FIG. 9 is an illustration of an exemplary memory module 900. Memory module 900 is illustrated as a memory card, although the concepts discussed with reference to memory module 900 are applicable to other types of removable or portable memory, e.g., USB flash drives, and are intended to be within the scope of "memory module" as used herein. In addition, although one example form factor is depicted in FIG. 9, these concepts are applicable to other form factors as well.

In some embodiments, memory module 900 will include a housing 905 (as depicted) to enclose one or more memory devices 910, though such a housing is not essential to all devices or device applications. At least one memory device 910 is a non-volatile memory having NAND architecture in accordance with an embodiment of the invention. Where present, the housing 905 includes one or more contacts 915 for communication with a host device. Examples of host devices include digital cameras, digital recording and playback devices, PDAs, personal computers, memory card readers, interface hubs and the like. For some embodiments, the contacts 915 are in the form of a standardized interface. For example, with a USB flash drive, the contacts 915 might be in the form of a USB Type-A male connector. For some embodiments, the contacts 915 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 915 provide an interface for passing control, address and/or data signals between the memory module 900 and a host having compatible receptors for the contacts 915.

The memory module 900 may optionally include additional circuitry 920 which may be one or more integrated circuits and/or discrete components. For some embodiments, the additional circuitry 920 may include a memory controller for controlling access across multiple memory devices 910 and/or for providing a translation layer between an external host and a memory device 910. For example, there may not be a one-to-one correspondence between the number of contacts 915 and a number of I/O connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is required for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910 such as logic functions as might be performed by an ASIC (application specific integrated circuit). Also, the additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

Non-volatile memory devices have been described utilizing a NAND architecture including multiple series-coupled select gates on the drain and/or source ends of the NAND strings. By utilizing multiple series-coupled select gates, each gate can be made using smaller features sizes while achieving the same level of protection against GIDL and other forms of current leakage. By reducing the feature size of the select gates, the footprint of the NAND strings can be reduced, thereby facilitating smaller memory device sizing.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A portion of a memory array, comprising:
   a string of two or more non-volatile memory cells;
   a first select gate coupled in series with a first non-volatile memory cell of the string of two or more non-volatile memory cells;

a second select gate coupled in series with the first select gate;

a third select gate coupled in series with a last non-volatile memory cell of the string of two or more non-volatile memory cells;

a fourth select gate coupled in series with the third select gate; and a bit line contact coupled to the fourth select gate and to a select gate of an opposing string of two or more non-volatile memory cells, wherein the bit line contact overlies at least a portion of the fourth select gate and wherein the bit line contact does not overlie any portion of the select gate of the opposing string of two or more non-volatile memory cells.

2. The portion of a memory array of claim 1, wherein at least one of the select gates has substantially a same separation and pitch as one of the memory cells.

3. The portion of a memory array of claim 2, wherein the pitch of at least one of the select gates is approximately two times a minimum feature size of a process used to fabricate the string of two or more non-volatile memory cells.

4. The portion of a memory array of claim 2, wherein each of the select gates has substantially the same separation and pitch as each of the memory cells.

5. The portion of a memory array of claim 1, wherein the first select gate and the second select gate are each coupled to receive the same control signal.

6. A NAND architecture memory cell string, comprising:
two or more series-coupled non-volatile memory cells;
a first select gate coupled in series with a first one of the series-coupled non-volatile memory cells;
a second select gate coupled in series with the first select gate;
a third select gate coupled in series with a last one of the series-coupled non-volatile memory cells;
a fourth select gate coupled in series with the third select gate; and
a bit line contact coupled to the fourth select gate and to a select gate of an opposing string of two or more series-coupled non-volatile memory cells, wherein the bit line contact overlies at least a portion of the fourth select gate and wherein the bit line contact does not overlie any portion of the select gate of the opposing string of two or more series-coupled non-volatile memory cells.

7. The NAND architecture memory cell string of claim 6, wherein at least one of the select gates has substantially a same separation and pitch as one of the memory cells.

8. The NAND architecture memory cell string of claim 7, wherein each of the select gates has substantially the same separation and pitch as each of the memory cells.

9. The NAND architecture memory cell string of claim 6, wherein the select gates and the memory cells have substantially the same construction.

10. The NAND architecture memory cell string of claim 9, wherein the construction includes conductive layers separated by dielectric material and wherein the conductive layers of the select gates are strapped.

11. A memory device, comprising:
an array of non-volatile memory cells having at least one bit line and at least one source line; and
circuitry for control and/or access of the array of non-volatile memory cells;
wherein the array of non-volatile memory cells comprises at least one string of two or more non-volatile memory cells;

wherein a first select gate is coupled in series with a first memory cell of the string of two or more non-volatile memory cells;
wherein a second select gate is coupled in series with the first select gate and interposed between the first select gate and a source line;
wherein a third select gate is coupled in series with a last memory cell of the string of two or more non-volatile memory cells;
wherein a fourth select gate is coupled in series with the third select gate and interposed between the third select gate and a particular bit line;
wherein a bit line contact is coupled to the particular bit line, to the fourth select gate and to a select gate of an opposing string of two or more non-volatile memory cells;
wherein the bit line contact overlies at least a portion of the fourth select gate; and
wherein the bit line contact does not overlie any portion of the select gate of the opposing string of two or more non-volatile memory cells.

12. The memory device of claim 11, wherein the first select gate and the second select gate are coupled to receive the same control signal, and wherein the third select gate and the fourth select gate are coupled to receive the same control signal.

13. The memory device of claim 12, wherein the non-volatile memory cells and the select gates each comprises two conductive portions separated by a dielectric portion, and wherein the two conductive portions of each of the select gates are strapped.

14. A memory device, comprising:
an array of non-volatile memory cells having at least one bit line and at least one source line; and
circuitry for control and/or access of the array of non-volatile memory cells;
wherein the array of non-volatile memory cells comprises at least one string of two or more series-coupled non-volatile memory cells;
wherein a first select gate is coupled in series with a first one of the two or more series-coupled non-volatile memory cells;
wherein a second select gate is coupled in series with the first select gate and interposed between the first select gate and a source line;
wherein a third select gate is coupled in series with a last one of the two or more series-coupled non-volatile memory cells;
wherein a fourth select gate is coupled in series with the third select gate and interposed between the third select gate and a particular bit line; and
wherein a bit line contact is coupled to the particular bit line, to the fourth select gate and to a select gate of an opposing string of two or more series-coupled non-volatile memory cells;
wherein the bit line contact overlies at least a portion of the fourth select gate; and
wherein the bit line contact does not overlie any portion of the select gate of the opposing string of two or more series-coupled non-volatile memory cells.

15. The memory device of claim 14, wherein a distance from the first one of the two or more series-coupled non-volatile memory cells to an outer edge of the second select gate is approximately four times a minimum feature size of a process used to fabricate the array of non-volatile memory cells.

16. The memory device of claim 15, wherein the first select gate and the second select gate of a string of two or more series-coupled non-volatile memory cells are each coupled to receive the same control signal.

17. The memory device of claim 14, wherein the non-volatile memory cells and the select gates have substantially the same construction and spacing.

18. A memory module, comprising:
a plurality of contacts; and
two or more memory devices, each having access lines selectively coupled to the plurality of contacts;
wherein at least one of the memory devices comprises:
an array of non-volatile memory cells having at least one bit line and at least one source line; and
circuitry for control and/or access of the array of non-volatile memory cells;
wherein the array of non-volatile memory cells comprises at least one string of two or more series-coupled non-volatile memory cells;
wherein a first select gate is coupled in series with a first one of the two or more series-coupled non-volatile memory cells;
wherein a second select gate is coupled in series with the first select gate and interposed between the first select gate and a source line;
wherein a third select gate is coupled in series with a last one of the two or more series-coupled non-volatile memory cells;
wherein a fourth select gate is coupled in series with the third select gate and interposed between the third select gate and a particular bit line;
wherein a bit line contact is coupled to the particular bit line, to the fourth select gate and to a select gate of an opposing string of two or more series-coupled non-volatile memory cells;
wherein the bit line contact overlies at least a portion of the fourth select gate; and
wherein the bit line contact does not overlie any portion of the select gate of the opposing string of two or more series-coupled non-volatile memory cells.

19. A memory module, comprising:
a housing having a plurality of contacts; and
one or more memory devices enclosed in the housing and selectively coupled to the plurality of contacts;
wherein at least one of the memory devices comprises:
an array of non-volatile memory cells having at least one bit line and at least one source line; and
circuitry for control and/or access of the array of non-volatile memory cells;
wherein the array of non-volatile memory cells comprises at least one string of two or more series-coupled non-volatile memory cells;
wherein a first select gate is coupled in series with a first one of the two or more series-coupled non-volatile memory cells;
wherein a second select gate is coupled in series with the first select gate and interposed between the first select gate and a source line;
wherein a third select gate is coupled in series with a last one of the two or more series-coupled non-volatile memory cells;
wherein a fourth select gate is coupled in series with the third select gate and interposed between the third select gate and a particular bit line; and
wherein a bit line contact is coupled to the particular bit line, to the fourth select gate and to a select gate of an opposing string of two or more series-coupled non-volatile memory cells;
wherein the bit line contact overlies at least a portion of the fourth select gate; and
wherein the bit line contact does not overlie any portion of the select gate of the opposing string of two or more series-coupled non-volatile memory cells.

20. An electronic system, comprising:
A processor; and
one or more memory device coupled to the processor, wherein at least one of the memory devices comprises:
an array of non-volatile memory cells having at least one bit line and at least one source line; and
circuitry for control and/or access of the array of non-volatile memory cells;
wherein the array of non-volatile memory cells comprises at least one string of two or more series-coupled non-volatile memory cells;
wherein a first select gate is coupled in series with a first one of the two or more series-coupled non-volatile memory cells;
wherein a second select gate is coupled in series with the first select gate and interposed between the first select gate and a source line;
wherein a third select gate is coupled in series with a last one of the two or more series-coupled non-volatile memory cells;
wherein a fourth select gate is coupled in series with the third select gate and interposed between the third select gate and a particular bit line; and
wherein a bit line contact is coupled to the particular bit line, to the fourth select gate and to a select gate of an opposing string of two or more series-coupled non-volatile memory cells;
wherein the bit line contact overlies at least a portion of the fourth select gate; and
wherein the bit line contact does not overlie any portion of the select gate of the opposing string of two or more series-coupled non-volatile memory cells.

\* \* \* \* \*

UNITED STATES PATENT AND TRADEMARK OFFICE
CERTIFICATE OF CORRECTION

| | |
|---|---|
| PATENT NO. | : 7,697,335 B2 |
| APPLICATION NO. | : 12/141718 |
| DATED | : April 13, 2010 |
| INVENTOR(S) | : Seiichi Aritome |

It is certified that error appears in the above-identified patent and that said Letters Patent is hereby corrected as shown below:

In column 10, line 50, in Claim 14, after "line;" delete "and".

In column 12, line 9, in Claim 19, after "line;" delete "and".

In column 12, line 20, in Claim 20, delete "A processor;" and insert -- a processor; --, therefor.

In column 12, line 42, in Claim 20, after "line;" delete "and".

Signed and Sealed this

Fifteenth Day of June, 2010

David J. Kappos
*Director of the United States Patent and Trademark Office*